US008136737B2

(12) United States Patent
Salfelner (10) Patent No.: US 8,136,737 B2
(45) Date of Patent: Mar. 20, 2012

(54) SYSTEM COMPRISED OF A CHIP AND A SUBSTRATE AND METHOD OF ASSEMBLING SUCH A SYSTEM

(75) Inventor: Anton Salfelner, Pernegg (AT)

(73) Assignee: NXP B.V., Eindhoven (NL)

(*) Notice: Subject to any disclaimer, the term of this patent is extended or adjusted under 35 U.S.C. 154(b) by 469 days.

(21) Appl. No.: 12/444,652

(22) PCT Filed: Sep. 25, 2007

(86) PCT No.: PCT/IB2007/053884
§ 371 (c)(1),
(2), (4) Date: Apr. 7, 2009

(87) PCT Pub. No.: WO2008/044159
PCT Pub. Date: Apr. 17, 2008

(65) Prior Publication Data
US 2010/0006653 A1  Jan. 14, 2010

(30) Foreign Application Priority Data
Oct. 9, 2006 (EP) ..................... 06021121

(51) Int. Cl.
*G06K 19/06* (2006.01)
(52) U.S. Cl. .................. 235/492; 235/375
(58) Field of Classification Search .......... 235/375, 235/492; 257/786, 728, 734, 773, 776
See application file for complete search history.

(56) References Cited

U.S. PATENT DOCUMENTS
7,256,482 B2 * 8/2007 Kummerl et al. ............ 257/676

2005/0190817 A1  9/2005 Batra et al.
2006/0055617 A1  3/2006 Hall
2006/0188003 A1  8/2006 Larsson FOREIGN PATENT DOCUMENTS
| JP | 2000 099 673 A | 4/2000 |
| JP | 2000 293 649 A | 10/2000 |
| JP | 2001 156 526 A | 6/2001 |
| JP | 2003 051806 A | 2/2003 |
| JP | 2003 067 699 A | 3/2003 |

* cited by examiner

*Primary Examiner* — Karl D. Frech (57) ABSTRACT

A system comprises a chip (71) and a substrate (78). The chip (71) comprises a circuitry and a mounting surface (83) with first and second contacts (73, 74, 75, 76). The substrate (78) comprises a surface (90) with first and second contact pads (79, 80) and an electrically conductive pad (91) connected to the first contact pad (79) by a low-resistive connection (93). The chip (71) is attached to the substrate (78) so that the mounting surface (83) is spaced apart from the first contact pad (75) and the electrically conductive pad (91). The mounting surface (83) overlaps partly the first contact pad (79) with a first overlapping area (B1) resulting in a first stray capacitor ($C_1$) and the electrically conductive pad (91) with a second overlapping area (B3) resulting in a second stray capacitor ($C_3$). The first contact pad (79) and the electrically conductive pad (91) are arranged on the surface (90) of the substrate (78) such that, if the chip (21) is misaligned laterally in respect to the surface (90), then the first overlapping area (B1) increases while the second overlapping area (B3) decreases, or the first overlapping area (B1) decreases while the second overlapping area (B3) increases.

13 Claims, 5 Drawing Sheets

SYSTEM COMPRISED OF A CHIP AND A SUBSTRATE AND METHOD OF ASSEMBLING SUCH A SYSTEM

FIELD OF THE INVENTION

The invention relates to a system comprised of a chip and a substrate and to a method of assembling such a system.

BACKGROUND OF THE INVENTION

When attaching a chip, which is also referred to as integrated circuit, to a carrier utilizing, for instance, flip-chip technology, then contacts of the chip may be connected to connection pads of the carrier. One example of such a scenario is the assembling of an RFID transponder being comprised of an antenna and a chip connected to the antenna.

Figure 1:
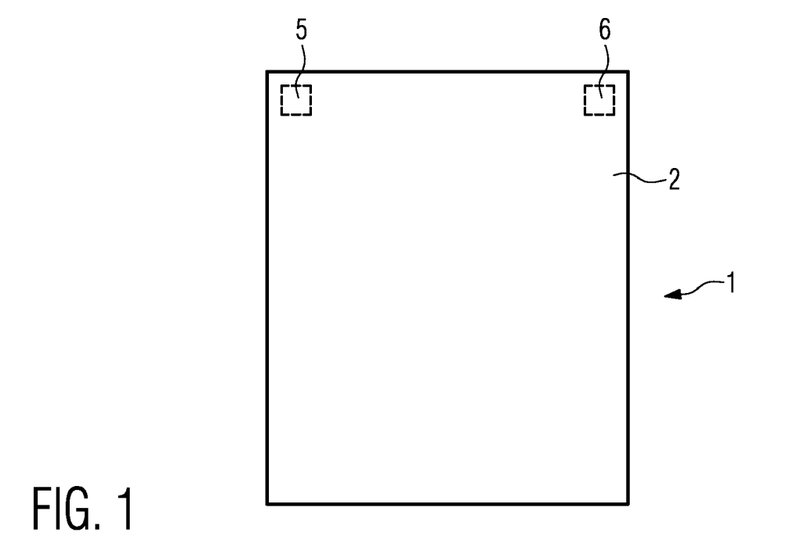
FIG. 1, as discussed above, is a topview of a chip.
Figure 2:
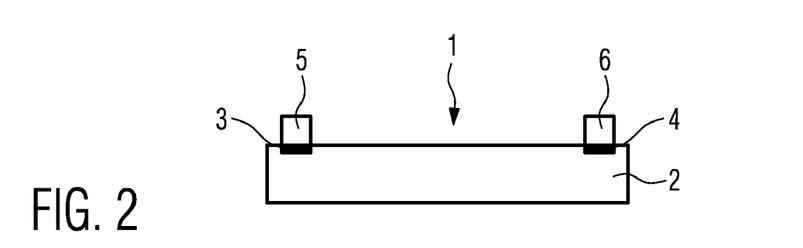
FIG. 2, as discussed above, is a sideview of the chip of FIG. 1.

FIG. 1 shows a topview and FIG. 2 shows a sideview of an example of such a chip 1. The chip 1 comprises a main body 2 which is basically a substrate made, for instance, from silicon enclosing a circuitry as it is commonly known in the art.

The chip 1 comprises a first chip contact pad 3 and a second chip contact pad 4 as contacts for the circuitry. For contacting the chip 1 to contacts of a carrier, the chip 1 comprises a first bump 5 applied on the first chip contact pad 3 and a second bump 6 applied on the second chip contact pad 4 for this example.

Figure 3:
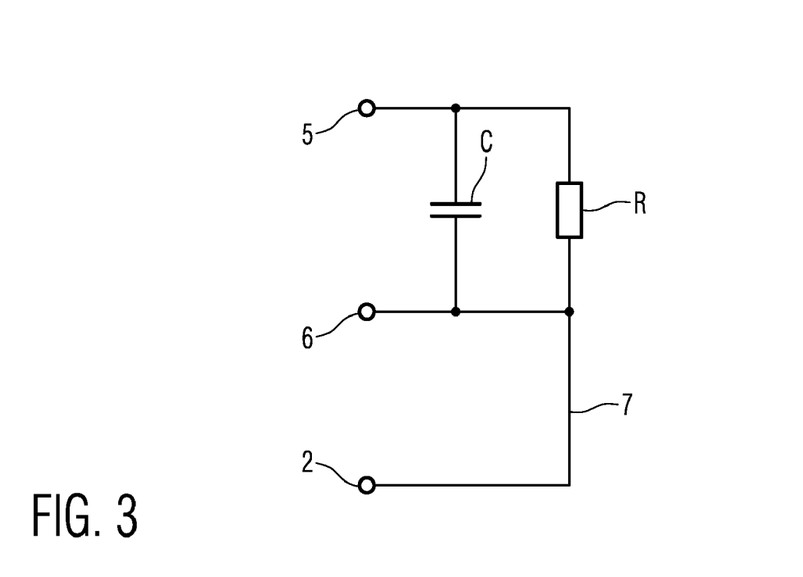
FIG. 3, as discussed above, is an equivalent circuit diagram of the input impedance of the chip of FIG. 1.

An impedance, Z, between the first and second chip contact pads 3, 4 is the input impedance of the circuitry of the chip 1. Its equivalent circuit is depicted in FIG. 3.

The input impedance, Z, can be modeled as a resistance, R, connected in parallel to a capacitor, C. Additionally, one of the two bumps 5, 6 may be connected to the main body 2 of the chip 1 via an electric connection having a relatively small resistance and/or a relative large capacitance. Neglecting this capacitance, which is particularly justifiable if the input signal for the chip 1 is a high frequency signal as it is normal for an FRID transponder, or neglecting this resistance, then this connection can be modeled as a short circuit 7 between the relevant bump 5, 6 and the main body 2. For the example shown, the second bump 6 is connected to the main body 2.

In order to contact electrically the chip 1 to contact pads of the carrier, the first and second bumps 5, 6 may be bonded to these contact pads.

Figure 4:
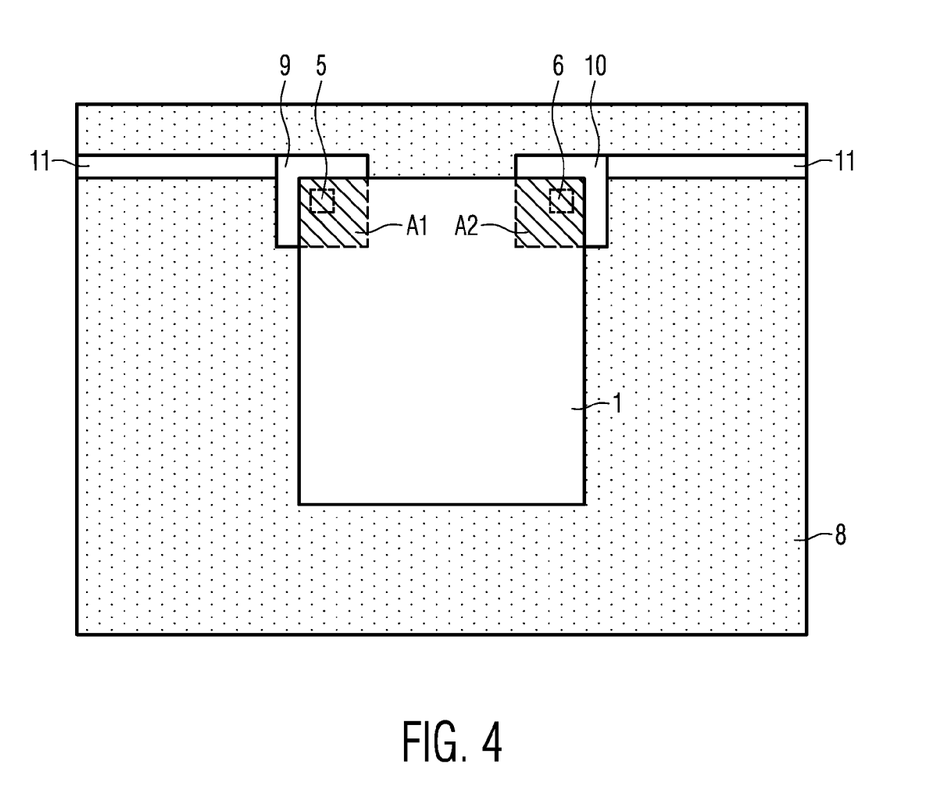
FIG. 4, as discussed above, is a topview of a combination of the chip of FIG. 1 attached to a carrier.
Figure 5:
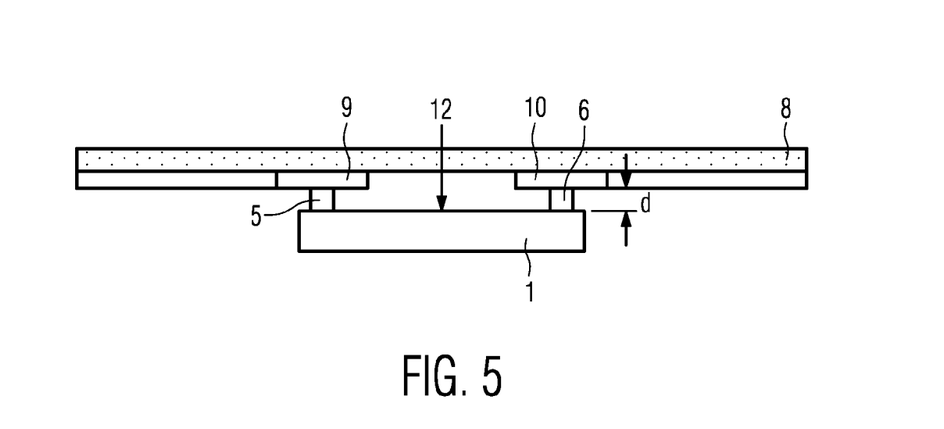
FIG. 5, as discussed above, is a sideview of the combination of FIG. 4.

FIG. 4 shows a topview and FIG. 5 shows a sideview of the chip 1 attached to a carrier, which is a plastic foil 8 for this example. The foil 8 comprises a first contact pad 9 and a second contact pad 10. The first bump 5 of the chip 1 contacts the first contact pad 9 and the second bump 6 of the chip 1 contacts the second contact pad 10 so that the chip 1 and the foil 8 are spaced apart. If the foil 8 carries an antenna 11, as it is the case for the example shown, then the contact pads 9, 10 may be contact terminals of the antenna 11.

The main body 2 of the chip 1 overlaps partly the connection pads 9, 10 of the foil 8. The overlapping areas are denoted by the reference signs A1 and A2, wherein the overlapping area A1 relates to the overlapping between the first contact pad 9 and the main body 2 and the overlapping area A2 relates to the overlapping between the second contact pad 10 and the main body 2 of the chip 1.

Each of the overlapping areas A1, A2 form stray capacitors with the main body 2 of the chip 1. Particularly, the overlapping area A1 results in a first stray capacitor, $C_1$, between the first contact pad 9 and the main body 2 and the overlapping area A2 results in a second stray capacitor, $C_2$, between the second contact pad 10 and the main body 2.

The resulting capacitances can be calculated according to the following equations:

$$C_1 = \varepsilon \frac{A1}{d}$$

$$C_2 = \varepsilon \frac{A2}{d}$$

wherein d is the distance between the contact pads 9, 10 of the foil 8 and a surface 12 of the main body 2 of the chip 1 facing towards the foil 8 and $\varepsilon$ is the permittivity.

Figure 6:
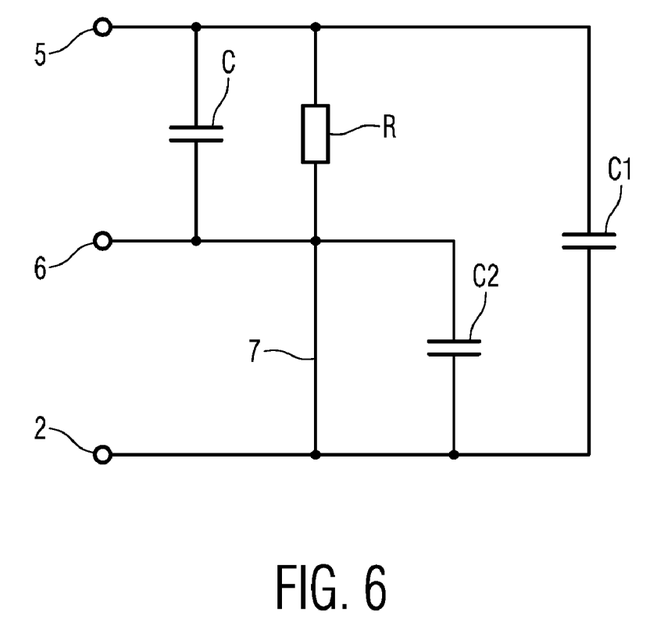
FIG. 6, as discussed above, is an equivalent circuit diagram of the combination of FIGS. 4 and 5.

A resulting equivalent circuit can be modeled as shown in FIG. 6. Since the second chip contact pad 4 is basically connected to the main body 2 of the chip 1 by the short circuit 7, the second stray capacitor, $C_2$, can be neglected. The first stray capacitor, $C_1$, however, has the effect that the resulting input capacitance, $C_{res}$, of the circuitry of the chip 1 mounted on the foil 8 becomes:

$$C_{res} = C + C_1$$

Particularly, when producing the foil 8 including the chip 1 attached thereon in relative high quantities, then the overlapping areas A1 of different assembled foil 8 chip 1 combinations are likely to differ, resulting in different resulting input capacitances, $C_{res}$, of the assembled combinations. Particularly, if the resulting input capacitance, $C_{res}$, affects the performance of the combination, as it may be the case for an RFID transponder, different resulting input capacitances, $C_{res}$, may affect negatively the performance of individual assembled foil 8 chip 1 combinations.

OBJECT AND SUMMARY OF THE INVENTION

It is an object of the present invention to provide a system comprised of a chip attached to a substrate, which chip has an effective input capacitance affected by stray capacitance due to its attachment to the substrate, wherein the effective capacitance vary less due to tolerances during the assembling process of the system.

It is a further object of the present invention to provide a corresponding method for producing such a system.

The object of the invention is achieved by means of a system, comprising:

a chip comprising a circuitry and a mounting surface which comprises first and second contacts for the circuitry as inputs of the circuitry; and a substrate comprising a surface, which comprises a first contact pad, a second contact pad, and an electrically conductive pad connected to the first contact pad by a low-resistive connection; the chip being attached to the substrate with the mounting surface facing toward the surface of the substrate so that the mounting surface is spaced apart from at least the first contact pad and the electrically conductive pad, the mounting surface partly overlapping the first contact pad with a first overlapping area and the electrically conductive pad with a second overlapping area so that the overlapped part of the first contact pad forms a first stray capacitor and the overlapped part of the electrically conductive pad forms a second stray capacitor with the mounting surface, and the first contact pad and the electrically conductive pad are arranged on the surface of the substrate such that, if the chip is misaligned laterally in respect to the surface of the substrate, then the first overlapping area increases while the second overlapping area decreases or the first overlapping area decreases while the second overlapping area increases.

As described in the introduction, a chip and particularly a chip for an RFID transponder has an input capacitance which is affected by stray capacitances caused by the chip housing and pads of the substrate. Pads are basically areas of a conductive material which form stray capacitors with the chip housing and particularly with the mounting surface of the chip. An example of such a stray capacitor is the first capacitor formed by the mounting surface partly overlapping the first contact pad and the part of the first contact pad which the mounting surface overlaps. The capacitance of the resulting stray capacitor depends on the overlapping area. Due to tolerances during manufacturing the inventive system, this overlapping is likely to vary for different chip/substrate systems. In order to compensate different values of the first stray capacitor, the inventive system comprises the electrically conductive pad which is connected to the first contact pad via the low-resistive connection, i.e. the electrically conductive and the first contact pads are connected by a short-circuit.

The part of the electrically conductive pad overlapped by the mounting surface forms also a stray capacitor, namely the second stray capacitor. Since the first contact and the electrically conductive pads are short circuited, the two stray capacitors are connected in parallel so that they form a resulting stray capacitor whose capacitance is the sum of the capacitances of the first and second stray capacitors.

When producing the inventive system, then it may happen, due to process tolerances, that different chips are attached to their substrates slightly shifted in respect to each other, resulting in different capacitance values of the first stray capacitors.

The first contact pad and the electrically conductive pad are located on the surface of the substrate such that, if the chip is misaligned laterally in respect to the surface of the substrate, the first overlapping area increases, if the second overlapping area decreases, and/or the first overlapping area decreases, if the second overlapping area increases. Since the capacitance of the resulting stray capacitor depends on the sum of the first and second overlapping areas, the value of the resulting stray capacitance will at least less fluctuate due to misalignment of the chip in respect to the substrate.

The substrate itself may, for example, be a plastic foil or a printed circuit board, or may be made from paper, ceramics, ferrite materials or a composite of these materials.

In one embodiment of the inventive system, the first contact pad and the electrically conductive pad are arranged on the surface of the substrate so that the first overlapping area decreases by the same amount as the second overlapping area increases and/or the first overlapping area increases by the same amount as the second overlapping area decreases, when moving the chip laterally. For this variant of the inventive system, the value of the resulting stray capacitor remains constant, resulting in a constant resulting input capacitance of the chip attached to the substrate.

The mounting surface may be rectangular shaped and may comprise four corners. Then, according to a further embodiment of the inventive system, the first contact pad and the electrically conductive pad are located on the surface of the substrate so that a first corner of the four corners overlaps partly the first contact pad and a second corner of the corners being opposite to the first corner overlaps partly the electrically conductive pad. The areas of the first contact pad and the electrically conductive pad may be approximately the same. In addition, chips for several inventive systems are likely to be misaligned in respect to each other by a relatively small degree. Then, this variant of the inventive system makes it possible that the sum of the first and the second overlapping areas remain constant, resulting in constant values of the resulting stray capacitor.

During manufacturing of the inventive system, the chip may be tilted slightly, particularly in respect to an axis running through opposite corners or in respect to an axis dividing the mounting surface in two halves. Then, the distance between the chip and the substrate differs along the mounting surface.

If, for instance, the chip is tilted in respect to one of the aforementioned axes, then the distance between the chip and the substrate may decrease around a specific corner. Then, however, the distance around the opposite corner increases by the same amount. Since the first contact pad and the electrically conductive pad are located at opposite corners, the capacitance of the stray capacitor related to the corner with decreasing distance increases, while the capacitance of the stray capacitor related to the corner with increasing distance decreases. Thus, the value of the resulting stray capacitor fluctuates less or even remains constant for this embodiment.

In a further embodiment of the inventive system, wherein the mounting surface is rectangular shaped, the mounting surface comprises four edges. Then, the first contact pad and the electrically conductive pad may be located on the surface of the substrate, so that a first edge of the four edges overlaps partly the first contact pad and a second edge of the edges being opposite to the first edge overlaps partly the electrically conductive pad. Particularly, if the overall areas of the first contact pad and the electrically conductive pad are substantially the same, different placements of the chip for different inventive systems remain constant.

The two contacts of the chip are the inputs for the circuitry of the chip. The second contact may be a ground contact and may particularly be connected to the mounting surface by a low resistive and/or a high capacitive path. If the input signal is a high frequency signal, then the high capacitive path is basically a short circuit.

The inventive system may especially be a part of an RFID transponder which comprises, besides the inventive system, an antenna arranged on the surface of the substrate and being connected to the first and second contact pads.

It is also usual for RFID transponders to mount the chip on a separate strap. Then, the inventive system may be such a strap on which the chip is attached, i.e. the substrate is the strap, and the antenna is arranged on the further substrate, wherein the antenna is electrically connected to the first and second contact pads.

The object of the invention is also achieved by means of a method for producing a system comprised of a chip attached to a substrate, comprising the steps of:

placing a chip, which comprises a circuitry and a mounting surface comprising first and second contacts for the circuitry as inputs for the circuitry, with its mounting surface on a surface of a substrate, wherein the surface comprises a first contact pad, a second contact pad, and an electrically conductive pad connected to the first contact pad by a low-resistive connection; and contacting the first contact with the first contact pad and the second contact with the second contact pad so that the mounting surface is spaced apart at least from the first contact pad and the electrically conductive pad, the mounting surface overlaps partly the first contact pad with a first overlapping area and the electrically conductive pad with a second overlapping area so that the overlapped part of the first contact pad forms a first stray capacitor and the overlapped part of the electrically conductive pad forms a second stray capacitor with the mounting surface, wherein the first contact pad and the electrically conductive pad are arranged on the surface of the substrate such that, if the chip is misaligned laterally in respect to the surface of the substrate, then the first overlapping area increases when the second overlapping area decreases or the first overlapping area decreases when the second overlapping area increases.

With the inventive method, the inventive system can be manufactured.

In one embodiment of the inventive method, the first contact pad and the electrically conductive pad are arranged on the surface of the substrate so that the first overlapping area decreases by the same amount as the second overlapping area increases and/or the first overlapping area increases by the same amount as the second overlapping area decreases, when misaligning the chip laterally in respect to the surface of the substrate. Then, the resulting stray capacitor remains basically constant for different aligned chips on the substrate.

The mounting surface may particularly be rectangular shaped and may comprise four corners, wherein the first contact pad and the electrically conductive pad may be located on the surface of the substrate so that a first corner of the four corners overlaps partly the first contact pad and a second corner of the corners being opposite to the first corner overlaps partly the electrically conductive pad. If the mounting surface is rectangular shaped, then it comprises four edges. Then, the first contact pad and the electrically conductive pad may be located on the surface of the substrate so that a first edge of the four edges overlaps partly the first contact pad and a second edge of the edges being opposite to the first edge overlaps partly the electrically conductive pad.

The second contact may be connected to the mounting surface by a low resistive and/or a high capacitive path. Then, the second contact may particularly be grounded.

BRIEF DESCRIPTION OF THE DRAWINGS

The invention will be described in greater detail hereinafter, by way of non-limiting examples, with reference to the embodiments shown in the drawings.

DESCRIPTION OF EMBODIMENTS

FIGS. 1 to 6 have been discussed in the introduction.

Figure 7:
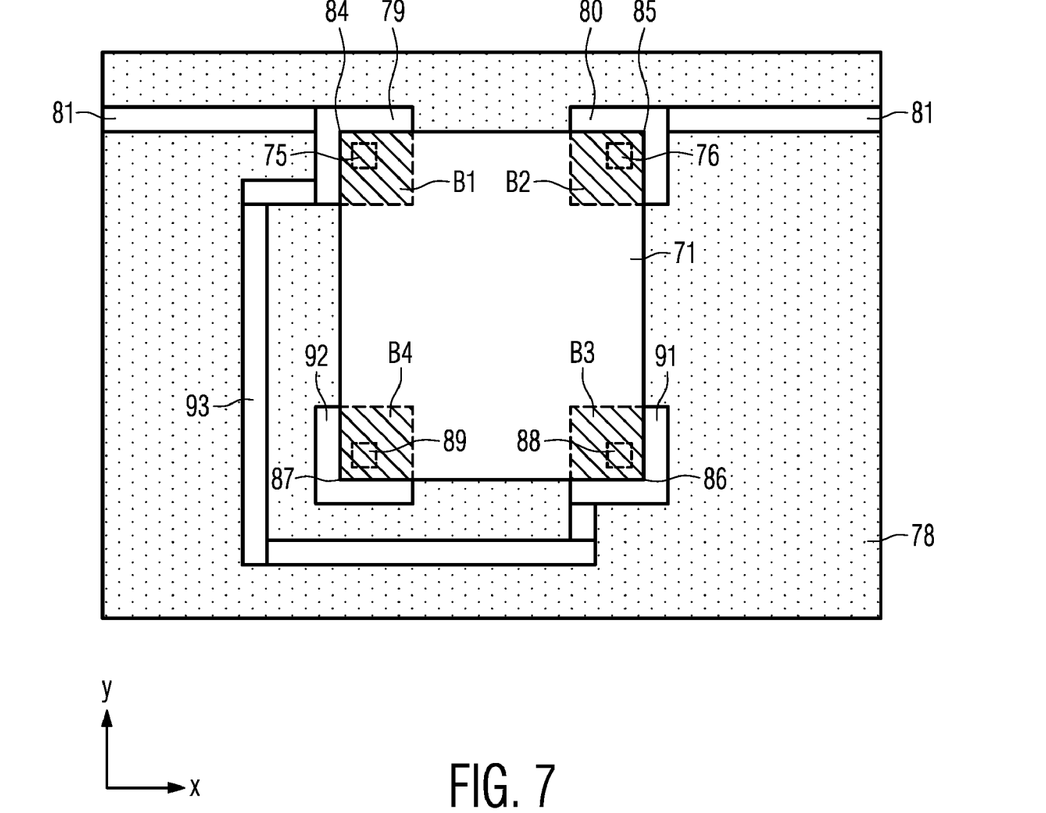
FIG. 7 is a topview of a combination of a further chip attached to a carrier.
Figure 8:
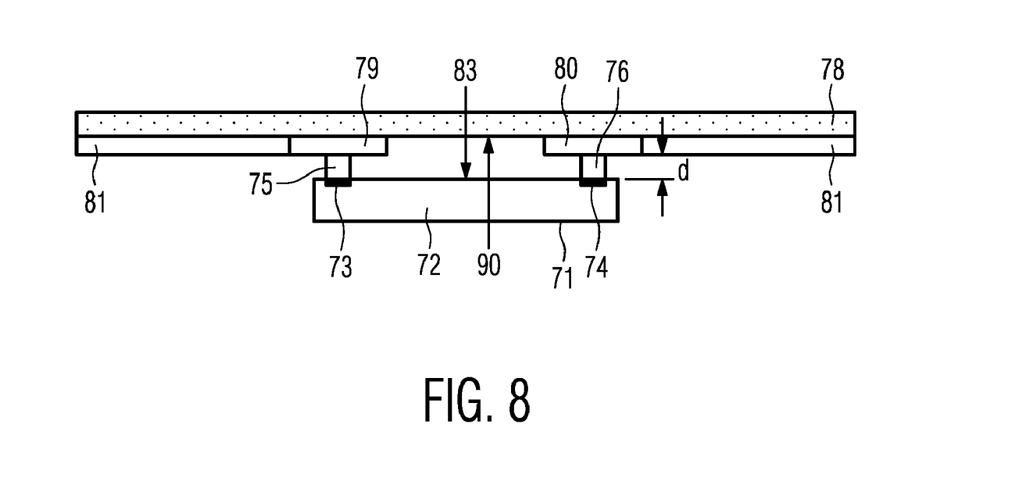
FIG. 8 is a sideview of the combination of FIG. 7.

FIG. 7 shows a topview of a chip 71 attached to a carrier or a substrate, which is a foil 78 made from plastic for the exemplary embodiment. FIG. 8 shows the corresponding sideview.

For the exemplary embodiment, the chip 71 comprises a circuitry enclosed by a main body 72 made, for instance, from silicon. The main body 72 comprises a rectangular shaped mounting surface 83 having four corners 84-87. The mounting surface 83 further comprises a first chip contact pad 73 and a second chip contact pad 74 for contacting the circuitry of the chip 71. The two chip contact pads 73, 74 are located at two adjacent corners 84, 85 of the mounting surface 83 for the exemplary embodiment. The input impedance, Z, of the circuitry of the chip 71 can be modeled, as for the chip 1 described in the introduction, as a resistance, R, connected in parallel to a capacitance, C.

For the exemplary embodiment, the mounting surface 83 of the chip 71 further comprises a first chip test pad and a second chip test pad for testing the performance of the circuitry of the chip 71 (the chip test pads are not explicitly shown in the figures). The first chip test pad is located at the corner 86 and the second chip test pad is located at the corner 87 of the mounting surface 83. Thus, the first chip test pad is located on the mounting surface 83 diametrical opposite to the first chip contact pad 73.

In order to attach the chip 71 to the foil 78, the chip 71 comprises bumps 75, 76, 88, 89 made, for instance, from gold for the exemplary embodiment. The bump 75 is applied on the first chip contact pad 73, the bump 76 is applied on the second chip contact pad 74, the bump 88 is applied on the first chip test pad, and the bump 89 is applied on the second chip test pad. Additionally, the second bump 76 is connected to the main body 72 of the chip 71 via an electric connection having a relatively small resistance and/or a relative large capacitance for the exemplary embodiment. This connection is not explicitly shown in the figures.

The foil 78 comprises a surface 90 which includes a first contact pad 79 and a second contact pad 80 made from an electrically conductive material. If the chip 71 is part of an RFID transponder, then the surface 90 of the foil 78 can include an antenna of the RFID transponder. Then, the contact pads 79, 80 may be terminals of this antenna. Alternatively, if the chip 71 is part of an RFID transponder, then the foil 78 may be a strap on which the chip 71 is attached. Then, the antenna of the RFID transponder may be attached to a further substrate (not explicitly shown in the figures, but well known to the skilled person). Then, the antenna can be contacted to conductive traces 81 connected to the contact pads 79, 80, as it is generally known in the art and shown in FIGS. 7, 8.

For the exemplary embodiment, the surface 90 of the foil 78 comprises first and second test pads 91, 92 made from an electrically conductive material. The first test pad 91 is connected to the first contact pad 79 via a low resistive connection path 93. Thus, the first test pad 91 and the first contact pad 79 are basically short circuited.

Additionally, the contact pads 79, 80 and the test pads 91, 92 are placed on the surface 90 of the foil 78 so that their respective centers form a rectangular for the exemplary embodiment.

In order to attach the chip 71 to the foil 78, the chip 71 is placed on the foil 78 with the mounting surface 83 facing toward the surface 90 of the foil 78 in such a way that the mounting surface 83 of the chip 71 overlaps the area of the surface 90 of the foil 78 defined by the centers of the contact pads 79, 80 and the test pads 91, 92. Thus, the contact pads 79, 80 and the test pads 91, 92 are placed on the surface 90 of the foil 78 and the chip 71 is attached to the foil 78 in such a way that the bump 75 contacts the first contact pad 79, the bump 76 contacts the second contact pad 80, the bump 88 contacts the first test pad 91, and the bump 89 contacts the second test pad 92. The chip 71 is thus attached to the foil 78 by a flip chip mounting process for the exemplary embodiment.

As a result, the mounting surface 83 of the chip 71 overlaps partly the contact pads 79, 80 and the test pads 91, 92. Specifically, the mounting surface 83 overlaps partly the first contact pad 79 at the corner 84, resulting in an overlapping area B1, the mounting surface 83 overlaps partly the second contact pad 80 at the corner 85, resulting in an overlapping area B2, the mounting surface 83 overlaps partly the first test pad 91 at the corner 86, resulting in an overlapping area B3, and the mounting surface 83 overlaps partly the second test pad 92 at the corner 87, resulting in an overlapping area B4.

Each of the overlapping areas B1 to B4 form stray capacitors with the main body 72 of the chip 71 and particularly with the mounting surface 83. Particularly, the overlapping area B1 results in a stray capacitor, $C_1$, between the first contact pad 73 and the main body 72, the overlapping area B2 results in a stray capacitor, $C_2$, between the second chip contact pad 74 and the main body 72, and the overlapping area B3 results in a stray capacitor, $C_3$, also between the first chip contact pad 73 and the main body 72, because the first contact pad 79 and the first test pad 91 are connected by the low resistive connection path 93.

The resulting capacitances can be calculated according to the following equations:

$$C_1 = \varepsilon \frac{B1}{d}$$

$$C_2 = \varepsilon \frac{B2}{d}$$

$$C_3 = \varepsilon \frac{B3}{d}$$

wherein d is the distance between the contact pads 79, 80 or the test pads 91, 92 of the foil 78 and the mounting surface 83 of the chip 71. $\varepsilon$ is the permittivity.

Since the first test pad 91 and the first contact pad 79 are short circuited by the path 93, the stray capacitors $C_1$ and $C_3$ are connected in parallel. Since the second bump 76 is connected to the main body 72 of the chip 71 via an electric connection having a relatively small resistance and/or a relative large capacitance for the exemplary embodiment, the resulting input capacitance, $C_{res}$, of the chip 71 attached to the foil 78 equals:

$$C_{res} = C + C_1 + C_3$$

wherein $C_1 + C_3$ is a resulting stray capacitor $C_{stray}$.

Figure 9:
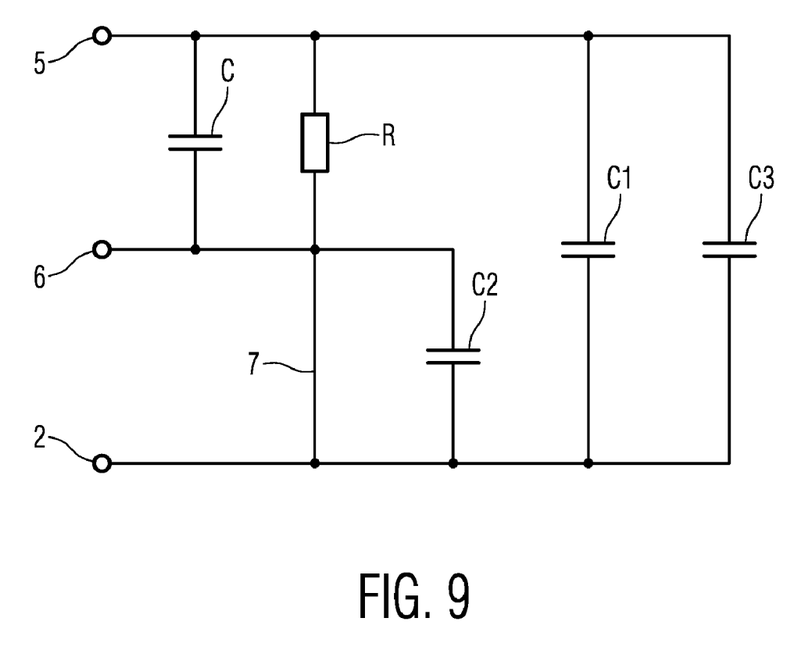
FIG. 9 is an equivalent circuit diagram of the combination of FIGS. 7 and 8.

FIG. 9 shows the corresponding equivalent circuit diagram.

The two stray capacitors $C_1$ and $C_3$ result in the resulting stray capacitor $C_{stray}$ whose capacitance depends on the sum of the two overlapping areas B1 and B3. If the first contact pad 79 and the first test pad 91 are placed on the foil 78 such that this area remains at least approximately constant for slightly misplaced chips 71 on the foil 78, then the resulting stray capacitors $C_{stray}$ for a plurality of chip 71/foil 78 combinations has at least approximately a constant capacitance, resulting in at least approximately constant input capacitances of these combinations.

The first contact pad 79 and the first test pad 91 are located at two opposite corners 84, 86 for the exemplary embodiment. Thus, if the chip 71 is slightly misaligned by, for instance, misplacing the chip 71 slightly toward a direction defined by the y-axis of FIG. 7, then the overlapping area B1 caused by the first contact pad 79 increases by a certain amount. At the same time, the overlapping area B3 caused by the first test pad 91 decreases. Additionally, as it is evident from FIG. 7 for the exemplary embodiment, the overlapping area B1 increases by the same amount as the overlapping area B3 decreases resulting in a constant resulting stray capacitance, $C_{stray}$.

If the chip 71 is slightly misaligned by, for instance, misplacing the chip 71 slightly toward a direction defined by the x-axis of FIG. 7, then the overlapping area B1 caused by the first contact pad 79 decreases by a certain amount. At the same time, the overlapping area B3 caused by the first test pad 91 increases. Additionally, as it is evident from FIG. 7 for the exemplary embodiment, the overlapping area B1 decreases by the same amount as the overlapping area B3 increases resulting in a constant resulting stray capacitance, $C_{stray}$.

Due to tolerances during the manufacturing process of attaching the chip 71 to the foil 78, the distance d between the chip 71 and the foil 78 may not be constant. Particularly, the mounting surface 83 may not be exactly parallel to the surface 90 of the foil 78, affecting especially the values of the stray capacitors $C_1$ and $C_3$, and thus the value of the resulting stray capacitor, $C_{stray}$. The chip 71 may particularly be tilted slightly in respect to four axes 101 to 104 shown in FIG. 10.

Figure 10:
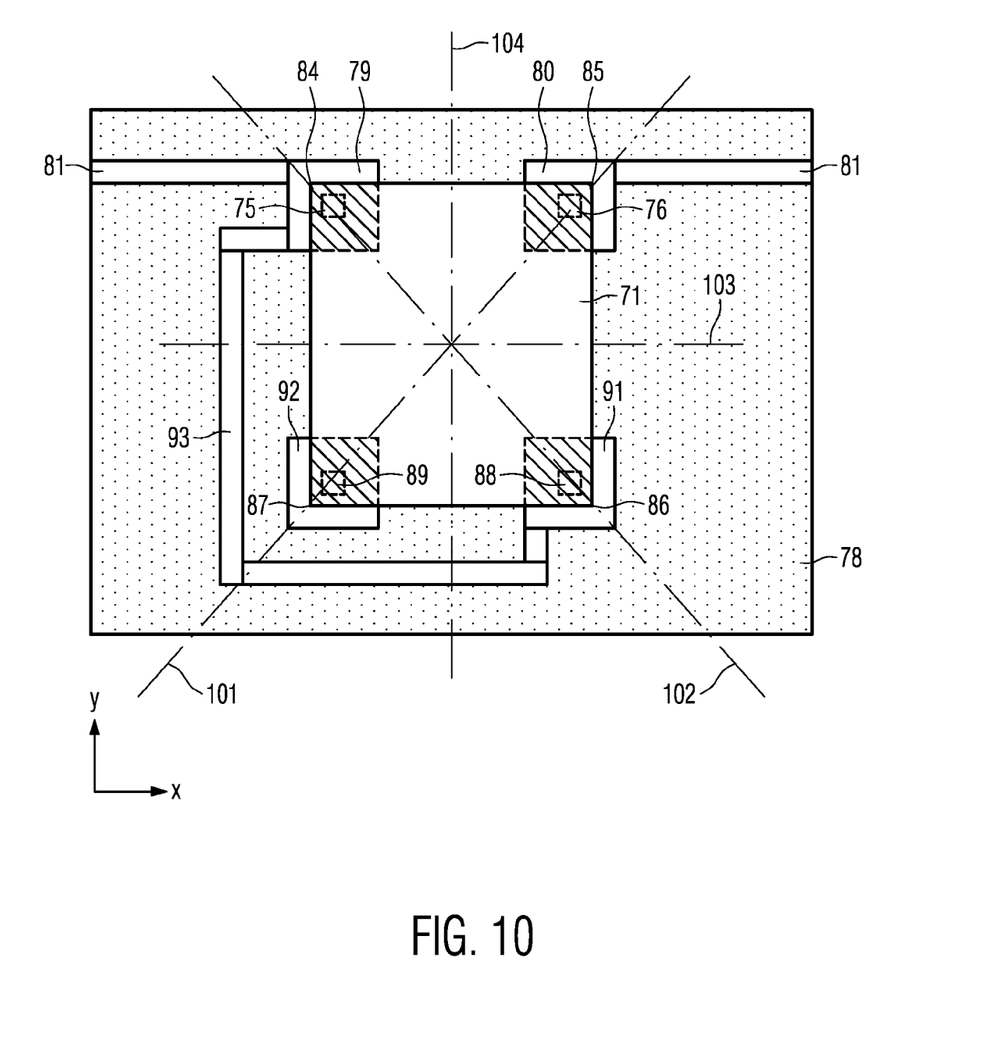
FIG. 10 is a further topview of the combination of FIG. 7.

For the exemplary embodiment, the first axis 101 runs through the second and forth corners 85, 87 and the second axis 102 runs through the first and third corners 84, 86. Each of the third axis 103 and fourth axis 104 divides the chip 71 in two halves, wherein the third axis 103 runs parallel to the x-axis and the fourth axis 104 runs parallel to the y-axis.

If the chip 71 is mounted to the foil 78 so that it is tilted slightly in respect to one of the axes 101 to 104, the distance d between the chip 71 and the foil 78 differs along the mounting surface 83.

If, for instance, the chip 71 is tilted in respect to one of the aforementioned axes 101-104, then the distance d between the chip 71 and the foil 78 may decrease around a specific corner, for instance, around the corner 84. Then, however, the distance d around the opposite corner, namely corner 86 increases by the same amount. Since the first contact pad 79 and the first test pad 91 are located at opposite corners 84, 86, the capacitance of the stray capacitor $C_1$ increases with decreasing distance d while the capacitance of the stray capacitor $C_3$ increases when the distance d decreases. Thus, the value of the resulting stray capacitor $C_{stray}$ fluctuates less or even remains constant for the exemplary embodiment.

Finally, it should be noted that the above-mentioned embodiments illustrate rather than limit the invention, and that those skilled in the art will be capable of designing many alternative embodiments without departing from the scope of the invention as defined by the appended claims. In the claims, any reference signs placed in parentheses shall not be construed as limiting the claims. The words "comprising" and "comprises", and the like, do not exclude the presence of elements or steps other than those listed in any claim or the specification as a whole. The singular reference of an element does not exclude the plural reference of such elements and vice-versa. In a device claim, enumerating several means, several of these means may be embodied by one and the same item of hardware. The mere fact that certain measures are recited in mutually different dependent claims does not indicate that a combination of these measures cannot be used to advantage.

The invention claimed is:

1. A system, comprising:
a chip that includes circuitry and a mounting surface (83) with first and second contacts as inputs for the circuitry; and
a substrate with a surface which includes a first contact pad, a second contact pad, and an electrically conductive pad connected to the first contact pad by a low-resistive connection; wherein the chip being attached to the substrate with the mounting surface facing toward the surface of the substrate so that the mounting surface is spaced apart from the first contact pad and the electrically conductive pad, the mounting surface partly overlapping the first contact pad with a first overlapping area and the electrically conductive pad with a second overlapping area so that the overlapped part of the first contact pad forms a first stray capacitor and the overlapped part of the electrically conductive pad forms a second stray capacitor with the mounting surface, and the first contact pad and the electrically conductive pad are arranged on the surface of the substrate such that, if the chip is misaligned laterally in respect to the surface of the substrate, then the first overlapping area increases while the second overlapping area decreases or the first overlapping area decreases while the second overlapping area increases.

2. The system according to claim 1, wherein the first contact pad and the electrically conductive pad are arranged on the surface of the substrate so that the first overlapping area decreases by the same amount as the second overlapping area increases or the first overlapping area increases by the same amount as the second overlapping area decreases, when the chip is misaligned.

3. The system according to claim 1, wherein the mounting surface is rectangular shaped and comprises four corners, and the first contact pad and the electrically conductive pad are located on the surface of the substrate so that a first corner of the four corners overlaps partly the first contact pad and a second corner of the corners being opposite to the first corner overlaps partly the electrically conductive pad.

4. The system according to claim 1, wherein the mounting surface is rectangular shaped and comprises four edges, the first contact pad and the electrically conductive pad are located on the surface of the substrate so that a first edge of the four edges overlaps partly the first contact pad and a second edge of the edges being opposite to the first edge overlaps partly the electrically conductive pad.

5. The system according to claim 1, wherein the second contact is connected to the mounting surface by a low resistive and/or a high capacitate path.

6. The system according to claim 1, further comprising:
an antenna arranged on the surface of the substrate and connected to the first and second contact pads.

7. The system according to claim 1, further comprising:
a further substrate; and
an antenna arranged on the further substrate and electrically connected to the first and second contact pads.

8. A method for producing a system comprised of a chip attached to a substrate, the method comprising the steps of:
mounting the chip, which includes circuitry and a mounting surface with first and second contacts as inputs for the circuitry, with the mounting surface on a surface of the substrate, wherein the surface includes a first contact pad, a second contact pad, and an electrically conductive pad; and connecting the first contact with the first contact pad and the second contact with the second contact pad so that the mounting surface is spaced apart from the first contact pad and the electrically conductive pad such that the mounting surface overlaps partly the first contact pad with a first overlapping area and the electrically conductive pad with a second overlapping area so that the overlapped part of the first contact pad forms a first stray capacitor and the overlapped part of the electrically conductive pad forms a second stray capacitor with the mounting surface;

orientating the first contact pad and the electrically conductive pad on the surface of the substrate such that if the chip is misaligned laterally in respect to the surface of the substrate, then the first overlapping area increases when the second overlapping area decreases or the first overlapping area decreases when the second overlapping area increases.

9. The method according to claim 8, further comprising;
orientating the first contact pad and the electrically conductive pad on the surface of the substrate so that the first overlapping area decreases by the same amount as the second overlapping area increases or the first overlapping area increases by the same amount as the second overlapping area decreases, when the chip is misaligned.

10. The method according to claim 8, wherein the mounting surface is rectangular shaped and comprises four corners, the method further comprising:
orientating the first contact pad and the electrically conductive pad on the surface of the substrate so that a first corner of the four corners overlaps partly the first contact pad and a second corner of the four corners being opposite to the first corner overlaps partly the electrically conductive pad.

11. The method according to claim 8, wherein the mounting surface is rectangular shaped and comprises four edges, the method further comprising:
orientating the first contact pad and the electrically conductive pad on the surface of the substrate so that a first edge of the four edges overlaps partly the first contact pad and a second edge of the four edges being opposite to the first edge overlaps partly the electrically conductive pad.

12. The method according to claim 8, further comprising:
connecting the second contact to the mounting surface by a low resistive or a high capacitive path.

13. The method according to claim 8, further comprising:
connecting the second contact to the mounting surface by a low resistive and high capacitive path.

* * * * *